(12) United States Patent
Yasukouchi et al.

(10) Patent No.: US 6,741,105 B2
(45) Date of Patent: May 25, 2004

(54) DIFFERENTIAL CIRCUIT AND PEAK HOLD CIRCUIT INCLUDING DIFFERENTIAL CIRCUIT

(75) Inventors: Katsuyuki Yasukouchi, Kasugai (JP); Ayuko Watabe, Kasugai (JP); Katsuya Shimizu, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/418,197

(22) Filed: Apr. 18, 2003

(65) Prior Publication Data

US 2003/0201801 A1 Oct. 30, 2003

(30) Foreign Application Priority Data

Apr. 26, 2002 (JP) .................................. 2002-126214

(51) Int. Cl.[7] .............................................. G11C 27/02
(52) U.S. Cl. ............................ 327/96; 327/95; 327/66
(58) Field of Search ........................... 327/52–54, 56, 327/58–60, 62–67, 72, 73, 77–83, 87–91, 93–96; 341/122

(56) References Cited

U.S. PATENT DOCUMENTS

| | | | | | |
|---|---|---|---|---|---|
| 5,488,289 | A | * | 1/1996 | Yeung | 323/312 |
| 6,181,169 | B1 | * | 1/2001 | Hu | 327/77 |
| 6,307,418 | B1 | * | 10/2001 | Dick | 327/303 |
| 6,420,909 | B1 | * | 7/2002 | Barnes | 327/63 |
| 6,489,814 | B2 | * | 12/2002 | Hoogzaad et al. | 327/94 |
| 6,617,886 | B2 | * | 9/2003 | Bright et al. | 327/65 |

* cited by examiner

Primary Examiner—My-Trang Nu Ton
(74) Attorney, Agent, or Firm—Arent Fox PLLC

(57) ABSTRACT

A peak hold circuit which improves the precision of a hold voltage. The peak hold circuit includes a first input transistor which receives an input voltage and a second input transistor which receives the hold voltage. The peak hold circuit further includes a hold capacitor, a hold-voltage setting transistor and a bypass circuit. The hold capacitor supplies the hold voltage to the second input transistor. The hold-voltage setting transistor receives base current from the collector of the first input transistor and makes the hold voltage coincide with the input voltage in accordance with the base current. The bypass circuit bypasses bias current to be supplied to the second input transistor when the hold-voltage setting transistor is turned off.

14 Claims, 3 Drawing Sheets

DIFFERENTIAL CIRCUIT AND PEAK HOLD CIRCUIT INCLUDING DIFFERENTIAL CIRCUIT

CROSS-REFERENCE TO RELATED APPLICATION

This application is based upon and claims the benefit of priority from Japanese Patent Application No. 2002-126214, filed on Apr. 26, 2002, the entire contents of which are incorporated herein by reference.

BACKGROUND OF THE INVENTION

The present invention relates to a peak hold circuit which detects and outputs the peak value of an input voltage.

Recently, there are growing demands for a lower supply voltage and lower power consumption for semiconductor devices that are used in various electronic devices. This necessitates that a peak hold circuit which is mounted on a semiconductor device should secure a fast and stable hold operation in addition to reduction in the supply voltage and power consumption.

FIG. 1 is a circuit diagram of a conventional peak hold circuit 50. The emitters of PNP transistors $Tr_1$ and $Tr_2$ are connected to a current source 1 which operates in accordance with the supply of a supply voltage Vcc. An input voltage Vin is supplied to the base of the transistor $Tr_1$ whose collector is supplied to the collector of an NPN transistor $Tr_3$ and the base of an NPN transistor $Tr_5$. The emitter of the transistor $Tr_3$ is connected to ground GND.

The collector of the transistor $Tr_2$ is connected to the collector of an NPN transistor $Tr_4$ and the bases of the transistors $Tr_3$ and $Tr_4$ and the emitter of the transistor $Tr_4$ is connected to the ground GND. The transistors $Tr_3$ and $Tr_4$ form a current mirror circuit.

The base of the transistor $Tr_2$ is connected to the collector of the transistor $Tr_5$ and an output terminal To and the emitter of the transistor $Tr_5$ is connected to the ground GND.

The output terminal To is connected to one end of a hold capacitor 2 whose other end is connected to the ground GND. The output terminal To is connected to a voltage supply (Vcc) via a reset switch 3.

In the peak hold circuit 50, with the supply voltage Vcc supplied, and the reset switch 3 is switched on, the hold capacitor 2 is charged and an output voltage Vout output from the output terminal To is reset to the supply voltage Vcc. As the reset switch 3 is switched on every predetermined time, the hold capacitor 2 is charged and the output voltage Vout output is reset to the supply voltage Vcc.

Next, the reset switch 3 is switched off, causing the input voltage Vin to be supplied to the base of the transistor $Tr_1$. When the input voltage Vin is lower than the supply voltage Vcc, the collector current of the transistor $Tr_1$ increases. As the collector currents of the transistors $Tr_3$ and $Tr_4$ do not increase, however, the collector current of the transistor $Tr_5$ increases, causing the hold capacitor 2 to be discharged.

As the output voltage Vout falls and becomes equal to the input voltage Vin, the collector currents of the transistors $Tr_1$ and $Tr_2$ become equal to each other. As a result, the transistor $Tr_5$ is turned off, stopping the discharging of the hold capacitor 2.

When the input voltage Vin becomes higher than the output voltage Vout, the collector current of the transistor $Tr_1$ decreases, thereby keeping the transistor $Tr_5$ switched off. Therefore, the output voltage Vout does not fall and the input voltage Vin is held.

The peak hold circuit 50 should improve the response speed of the output voltage Vout with respect to the input voltage Vin. This requires that a bias current $I_B$ which is supplied to the transistors $Tr_1$ and $Tr_2$ from the current source 1 should be increased to increase the collector currents of the transistors $Tr_1$ and $Tr_2$.

That is, in a case where the input voltage Vin becomes higher than the output voltage Vout after the output voltage Vout is held at the minimum voltage, the transistor $Tr_5$ should be turned off promptly to stop the discharging of the hold capacitor 2. This requires that the base current of the transistor $Tr_5$ should be absorbed quickly by the collector current of the transistor $Tr_3$ which operates according to the collector current of the transistor $Tr_2$. To improve the accuracy of the hold voltage, therefore, it is necessary to increase the bias current $I_B$ supplied from the current source 1.

If the collector current (bias current $I_B$) of the transistor $Tr_2$ is increased, however, the base current of the transistor $Tr_2$ increases, so that the base current flows into the hold capacitor 2 at the time of the hold operation. This brings about the shortcoming that the output voltage Vout rises gradually, thus lowering the accuracy of the peak hold voltage.

Changing the transistors $Tr_1$ and $Tr_2$ to P channel MOS transistors can overcome the problem of the reduced accuracy of the hold voltage. However, the threshold value of MOS transistors is about 1 V, which is greater than the base-emitter voltage $V_{BE}$ of bipolar transistors. The output voltage Vout is therefore held so long as it is lower by at least 1 V than the supply voltage Vcc. The use of PMOS transistors therefore makes it difficult to cope with the reduction in supply voltage Vcc.

PMOS transistors vary considerably and the amplification factor of the PMOS transistors is smaller than that of bipolar transistors. This makes the control of the transistor $Tr_5$ unstable, which may lead to lower accuracy of the output voltage Vout. Further, the coexistence of bipolar transistors and PMOS transistors complicates the fabrication process.

SUMMARY OF THE INVENTION

In one aspect of the present invention, a differential circuit receives first and second input voltages. The differential circuit includes a first input transistor for receiving the first voltage. A second input transistor is connected to the first input transistor to receive the second input voltage. A current source is connected to the first and second input transistors to supply bias current to the first and second input transistors. A bypass circuit is connected to the first and second input transistors and the current source, for bypassing the bias current to suppress an increase in collector current of the first input transistor or the second input transistor based on the first and second input voltages.

A further aspect of the present invention is a peak hold circuit for receiving an input voltage and making a hold voltage. The peak hold circuit includes a first input transistor having a base for receiving an input voltage. A second input transistor is connected to the first input transistor and has a base to receive the hold voltage. A current mirror circuit is connected to the first and second input transistors to supply identical collector current to the first and second input transistors. A hold capacitor is connected to the second input transistor to supply the hold voltage to the second input transistor. A reset switch is connected to the hold capacitor to reset the hold voltage. A hold-voltage setting transistor is connected to the hold capacitor and the first and second input transistors to receive base current from the collector of the first input transistor and make the hold voltage coincide with the input voltage in accordance with the base current. A bypass circuit is connected to the second input transistor, for bypassing bias current to be supplied to the second input transistor when the hold-voltage setting transistor is turned off.

A further aspect of the present invention is a peak hold circuit for receiving an input voltage and making a hold voltage. The peak hold circuit includes a first differential circuit including a first input transistor having a base for receiving the input voltage and a collector, a second input transistor connected to the first input transistor and having a base for receiving the hold voltage, and a first current mirror circuit, connected to the first and second input transistors, for supplying a same collector current to the first and second input transistors. A hold capacitor is connected to the second input transistor to supply the hold voltage to the second input transistor. A reset switch is connected to the hold capacitor to reset the hold voltage. A hold-voltage setting transistor is connected to the hold capacitor and the first and second input transistors to receive base current from the collector of the first input transistor and make the hold voltage coincide with the input voltage in accordance with the base current. A second differential circuit is connected in parallel to the first differential circuit and includes a third input transistor having a base for receiving the input voltage, a fourth input transistor connected to the hold capacitor and having a base for receiving the hold voltage, and a second current mirror circuit, connected to the third and fourth input transistors, for supplying identical collector current to the third and fourth input transistors. A negative feedback circuit is connected to the second input transistor, for reducing a bias current to the second input transistor in accordance with the hold voltage when the hold-voltage setting transistor is turned off due to voltage difference between the input voltage and the hold voltage.

A further aspect of the present invention is a method of holding a voltage in a peak hold circuit that includes a current source, a bypass circuit connected to the current source, a first input transistor, a second input transistor, a hold capacitor connected to the second input transistor for holding the voltage, and a hold-voltage setting transistor connected to the hold capacitor for charging and discharging the hold capacitor. The method includes steps of supplying bias current from the current source to the first input transistor and the second input transistor, supplying an input voltage to the first input transistor and supplying a hold voltage from the hold capacitor to the second input transistor, allowing the first input transistor to enable the hold-voltage setting transistor to discharge the hold capacitor when the input voltage is lower than the hold voltage, and disabling the hold-voltage setting transistor and allowing the bypass circuit to bypass bias current to be supplied to the second input transistor, when the hold voltage decreases to the input voltage.

A further aspect of the present invention is a comparator for receiving first and second input voltages. The comparator includes a first input transistor for receiving the first input voltage. A second input transistor is connected to the first input transistor to receive the second input voltage. A current mirror circuit is connected to the first and second input transistors to supply identical collector current to the first and second input transistors. A negative feedback circuit is connected to the first and second input transistors to suppress an increase in collector current of the first input transistor or the second input transistor based on the first and second input voltages. An output transistor is connected to the current mirror circuit and the negative feedback circuit and is driven by the current mirror circuit and the negative feedback circuit.

A further aspect of the present invention is a comparator for receiving first and second input voltages. The comparator includes a first input transistor having a base for receiving the first input voltage and a collector. A second input transistor having an emitter connected to an emitter of the first input transistor and a base to receive the second input voltage. The comparator includes high-potential and low-potential voltage supplies. A current source is connected between the emitter of the first input transistor, the emitter of the second input transistor and the high-potential voltage supply. A first NPN transistor has a collector connected to the collector of the first input transistor, an emitter connected to a low-potential voltage supply, and a base. A second NPN transistor has a base connected to the base and the collector of the first NPN transistor and an emitter connected to the low-potential voltage supply. A feedback transistor has a collector connected to the current source, the emitter of the first input transistor and the emitter of the second input transistor, a base connected to the collector of the first input transistor and an emitter connected to the low-potential voltage supply. A drive transistor has a base connected to the base of the feedback transistor and an emitter connected to the low-potential voltage supply. An output transistor has a base connected to a collector of the drive transistor, an emitter connected to the high-potential voltage supply and a collector. An output terminal is connected to the collector of the output transistor.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
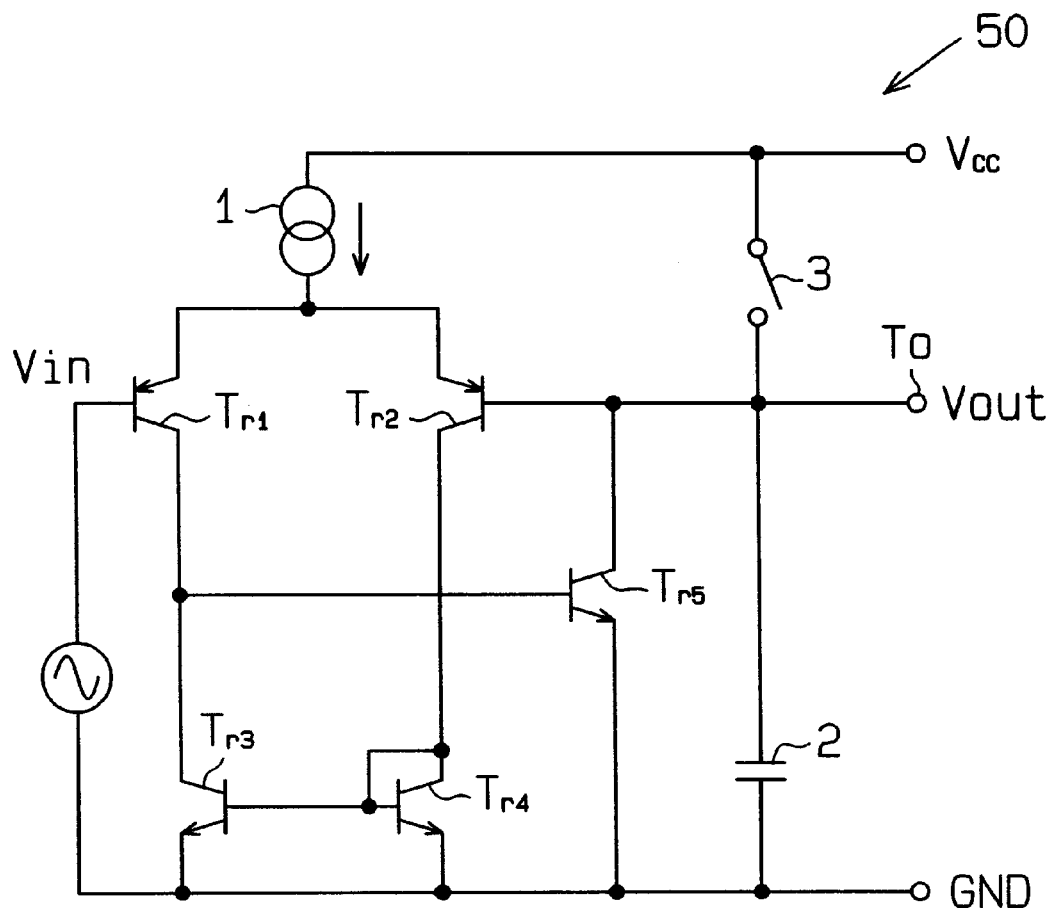
FIG. 1 is a schematic circuit diagram of a conventional peak hold circuit.

In the drawings, like numerals are used for like elements throughout.

Figure 2:
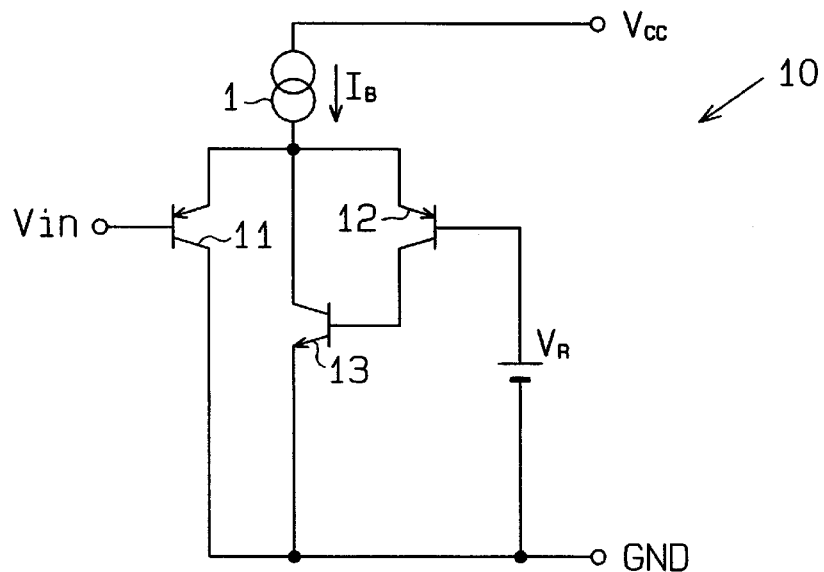
FIG. 2 is a schematic circuit diagram of a differential circuit according to a first embodiment of the present invention.

FIG. 2 shows a differential circuit 10 according to the first embodiment of the present invention. The differential circuit 10 includes a current source 1, a first input transistor 11, a second input transistor 12 and a bypass circuit 13. The first input transistor 11 receives a first input voltage Vin and the second input transistor 12 receives a second input voltage $V_R$.

The current source 1 supplies a bias current $I_B$ to the first and second input transistors 11 and 12. The bypass circuit 13 bypasses the bias current $I_B$ to be supplied to the first and second input transistors 11 and 12 in accordance with the first and second input voltages Vin and $V_R$, when the collector current of the first or second input transistor 11 or 12 increases. Accordingly, the collector current of the first or second input transistor 11 or 12 is suppressed to a predetermined value which is set by the bypass circuit 13.

Figure 3:
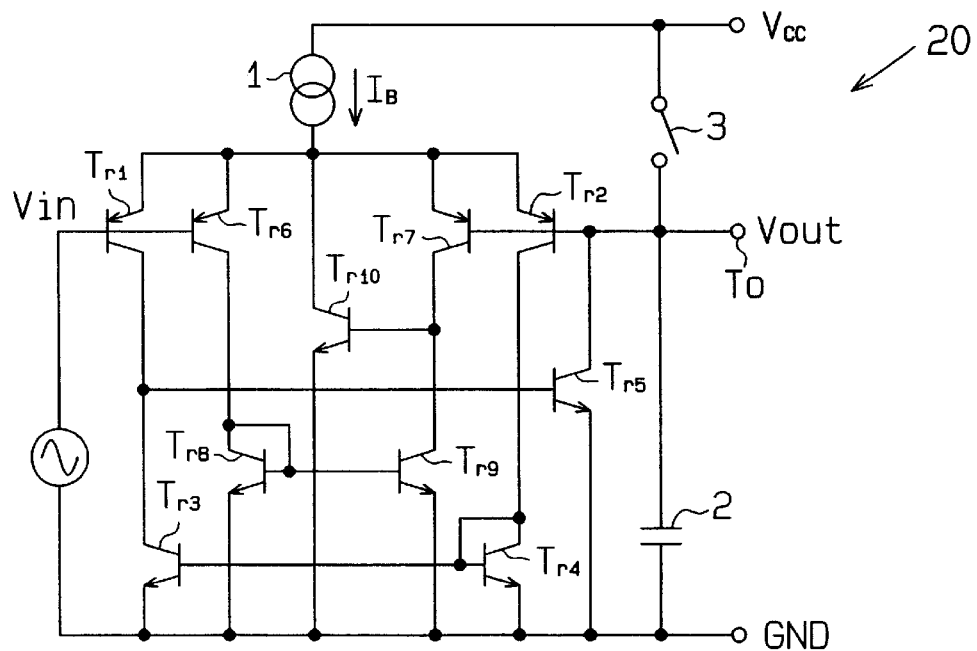
FIG. 3 is a schematic circuit diagram of a peak hold circuit according to a second embodiment of the present invention.

FIG. 3 shows a peak hold circuit 20 according to the second embodiment of the present invention. The peak hold circuit 20 includes transistors $Tr_6$ to $Tr_{10}$ in addition to the components of the conventional peak hold circuit 50 in FIG. 1.

The peak hold circuit 20 includes a first differential circuit, a second differential circuit and the transistor $Tr_{10}$. The first differential circuit includes the first input transistor $Tr_1$, the second input transistor $Tr_2$ and a first current mirror circuit. The first current mirror circuit includes the transistors $Tr_3$ and $Tr_4$.

The second differential circuit includes the third input transistor $Tr_6$, the fourth input transistor $Tr_7$ and a second current mirror circuit. The second current mirror circuit includes the transistors $Tr_8$ and $Tr_9$. The transistor $Tr_{10}$ is a bypass circuit. The transistors $Tr_1$, $Tr_2$, $Tr_6$ and $Tr_7$ are preferably PNP transistors, and the transistors $Tr_3$, $Tr_4$, $Tr_5$, $Tr_8$, $Tr_9$ and $Tr_{10}$ are preferably NPN transistors.

The first input transistor $Tr_1$ receives the first input voltage Vin and the second input transistor $Tr_2$ receives an output voltage (second input voltage) Vout.

The NPN transistor $Tr_5$ is a hold-voltage setting transistor which pulls down the charge voltage of the hold capacitor 2 to the level of the input voltage Vin.

The third input transistor $Tr_6$ has an emitter connected to the current source 1 and receives the input voltage Vin at its base. The collector of the third input transistor $Tr_6$ is connected to the bases of the NPN transistors $Tr_8$ and $Tr_9$ and the collector of the transistor $Tr_8$. The emitters of the transistors $Tr_8$ and $Tr_9$ are connected to the ground (low-potential power supply) GND.

The fourth input transistor $Tr_7$ has an emitter connected to the current source 1 and receives the output voltage Vout at its base. The collector of the transistor $Tr_7$ is connected to the collector of the transistor $Tr_9$.

The transistor $Tr_{10}$ has a collector connected to the current source 1, a base connected to the collector of the transistor $Tr_7$ and an emitter connected to the ground GND. The transistor $Tr_{10}$ together with the transistor $Tr_7$ forms a negative feedback circuit.

When the input voltage Vin lower than the supply voltage Vcc is supplied to the base of the transistor $Tr_1$ after the output voltage Vout has been reset to the supply voltage Vcc, the collector current of the transistor $Tr_1$ increases. As a result, the base current is connected to the transistor $Tr_5$, causing the collector current to flow into the transistor $Tr_5$. The hold capacitor 2 is discharged in accordance with the collector current, causing the output voltage Vout to drop.

At this time, the collector current of the transistor $Tr_6$ also increases in accordance with the input voltage Vin and the increased collector current of the transistor $Tr_6$ increases the collector currents of the transistors $Tr_8$ and $Tr_9$. As the base current of the transistor $Tr_{10}$ is absorbed by the transistor $Tr_9$, the transistor $Tr_{10}$ is kept switched off.

When the output voltage Vout falls to the level of the input voltage Vin, the collector current of the transistor $Tr_1$ decreases and the collector current of the transistor $Tr_2$ increases, thus increasing the collector currents of the transistors $Tr_3$ and $Tr_4$. As the increase in the collector current of the transistor $Tr_3$ causes the base current of the transistor $Tr_5$ to be absorbed by the collector of the transistor $Tr_3$, the transistor $Tr_5$ is turned off. Unless the input voltage Vin drops below the output voltage Vout, this state is maintained. Therefore, the output voltage Vout is held at the minimum input voltage Vin.

The collector current of the transistor $Tr_6$ further decreases with a reduction in the collector current of the transistor $Tr_1$. Then, the collector currents of the transistors $Tr_8$ and $Tr_9$ decrease. In accordance with a reduction in output voltage Vout, the collector current of the transistor $Tr_7$ increases. As a result, the collector current of the transistor $Tr_{10}$ increases, so that the bias current $I_B$ to be supplied from the current source 1 flows into the transistor $Tr_{10}$.

At this time, the same collector current flows in the transistors $Tr_7$ and $Tr_2$. The base current, $I_{B7}$, that flows in the transistor $Tr_7$ is expressed by the following equation.

$$I_{B7} \approx I_B/(hfe10 \ast hfe7)$$

where hfe7 is the amplification factor of the transistor $Tr_7$ and hfe10 is the amplification factor of the transistor $Tr_{10}$.

The same base current $I_{B7}$ flows into the transistors $Tr_7$ and $Tr_2$ and the base current $I_{B7}$ flows into the hold capacitor 2. The flow-in current $I_{BI}$ to the hold capacitor 2 is expressed by the following equation.

$$I_{BI} \approx 2 \ast I_B/(hfe10 \ast hfe7)$$

In the prior art, the base current $I_{Bi}$ of the transistor $Tr_2$ that flows into the hold capacitor 2 is expressed by the following equation.

$$I_{Bi} \approx I_B/hfe2$$

If the amplification factor hfe2 of the transistor $Tr_2$ is equal to the amplification factor hfe7 of the transistor $Tr_7$, the ratio of $I_{BI}$ to $I_{Bi}$ is expressed by the following equation.

$$I_{BI}:I_{Bi}=(2/hfe10):1$$

Therefore, the flow-in current $I_{BI}$ to the hold capacitor 2 in the second embodiment is sufficiently smaller than the flow-in current $I_{Bi}$ in the prior art. Because, unlike in the prior art, the second differential circuit including the transistors $Tr_6$ and $Tr_7$ is connected in parallel to the first differential circuit including the transistors $Tr_1$ and $Tr_2$, the drive performance of the transistor $Tr_5$ decreases and the response speed drops. To acquire the response speed equivalent to the response speed of the prior art, therefore, the bias current $I_B$ should be set double the bias current in the prior art. Thus, the ratio of $I_{BI}$ to $I_{Bi}$ is substantially expressed by the following equation.

$$I_{BI}:I_{Bi}=(4/hfe10):1$$

If the amplification factor hfe10 of the transistor $Tr_{10}$ is "120", for example, the flow-in current $I_{BI}$ to the hold capacitor 2 becomes about 1/30 of the flow-in current $I_{Bi}$ in the prior art.

The peak hold circuit 20 according to the second embodiment has the following advantages.

(1) At the time of the peak hold operation, the precision of the hold voltage can be improved by reducing the flow-in current $I_{BI}$ to the hold capacitor 2.

(2) As it is unnecessary to reduce the bias current $I_B$, the response speed of the output voltage Vout to the input voltage Vin does not drop.

(3) Because all the transistors are bipolar transistors, it is possible to cope with the reduction of the supply voltage Vcc as compared with the case of using MOS transistors.

(4) Because all the transistors are bipolar transistors, it is possible to improve the precision of the hold voltage as compared with the case of using MOS transistors.

Figure 4:
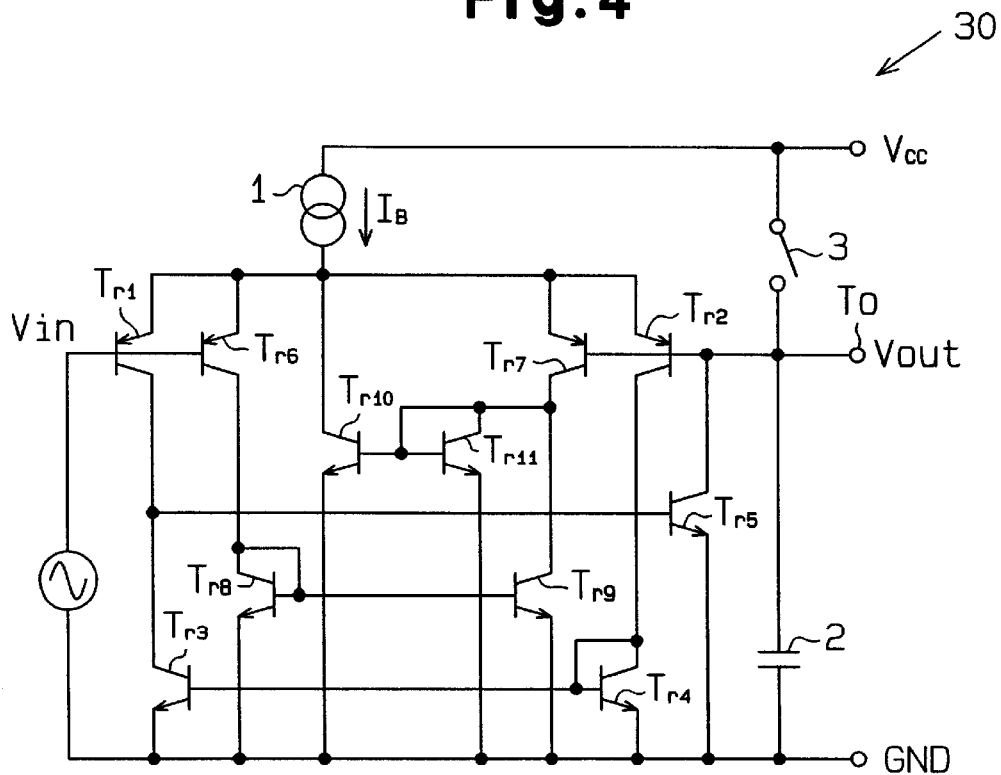
FIG. 4 is a schematic circuit diagram of a peak hold circuit according to a third embodiment of the present invention.

FIG. 4 shows a peak hold circuit 30 according to the third embodiment of the present invention. The third embodiment has an NPN transistor $Tr_{11}$ in addition to the structure of the second embodiment.

The collector of the transistor $Tr_{11}$ is connected to the collector of the transistor $Tr_7$ and the bases of the transistors $Tr_{10}$ and $Tr_{11}$ are connected to the collector of the transistor $Tr_7$. The emitter of the transistor $Tr_{11}$ is connected to the ground GND.

In the peak hold circuit 30, the transistors $Tr_{10}$ and $Tr_{11}$ perform a current mirror operation. The collector current of the transistor $Tr_7$ is supplied to the transistors $Tr_{10}$ and $Tr_{11}$ as the base current and supplied as the collector current of the transistor $Tr_{11}$.

Therefore, the peak hold circuit 30 according to the third embodiment has the following advantages.

(1) The gain of the negative feedback loop by the transistors $Tr_7$ and $Tr_{10}$ can be set adequately by appropriately setting the size ratio of the transistors $Tr_{10}$ and $Tr_{11}$. This can prevent the occurrence of oscillation.

(2) It is possible to prevent the emitter potentials of the transistors $Tr_1$, $Tr_2$, $Tr_6$ and $Tr_7$ from over-dropping when the transistor $Tr_{10}$ is turned on. This improves the reliability of the first and second differential circuits.

Figure 5:
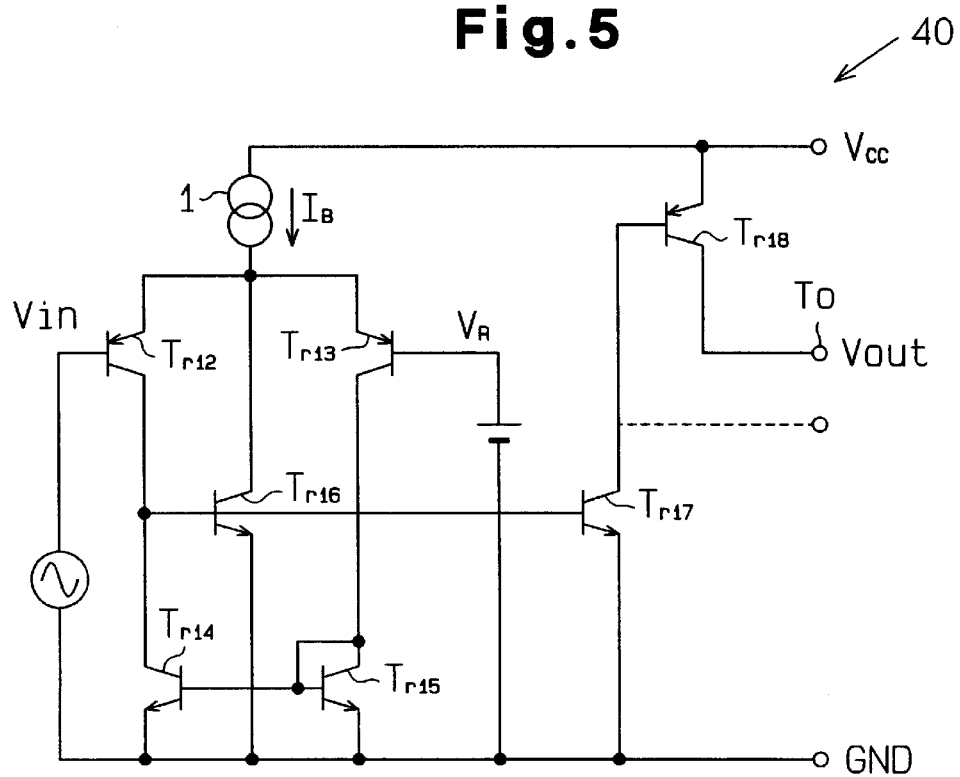
FIG. 5 is a schematic circuit diagram of a comparator according to a fourth embodiment of the present invention.

FIG. 5 shows a comparator 40 according to the fourth embodiment of the present invention. The comparator 40 has the second differential circuit according to the second or third embodiment.

The second differential circuit includes PNP transistors $Tr_{12}$ and $Tr_{13}$ and NPN transistors $Tr_{14}$ and $Tr_{15}$. The emitters of the PNP transistors $Tr_{12}$ and $Tr_{13}$ are connected to the current source 1 that operates in accordance with the supply voltage Vcc, and the collector of the transistor $Tr_{12}$ is connected to the collector of the transistor $Tr_{14}$.

The collector of the transistor $Tr_{13}$ is connected to the collector of the transistor $Tr_5$ and the bases of the transistors $Tr_{14}$ and $Tr_{15}$. The emitters of the transistors $Tr_{14}$ and $Tr_{15}$ are connected to the ground GND. The transistors $Tr_{14}$ and $Tr_{15}$ perform a current mirror operation.

The input voltage Vin is supplied to the base of the transistor $Tr_{12}$ and a reference voltage $V_R$ is supplied to the base of the transistor $Tr_{13}$. The collector of the transistor $Tr_{12}$ is connected to the bases of NPN transistors $Tr_{16}$ and $Tr_{17}$. The transistor $Tr_{16}$ has a collector connected to the current source 1 and an emitter connected to the ground GND.

The transistor $Tr_{17}$ has a collector connected to the base of the output PNP transistor $Tr_{18}$ and an emitter connected to the ground GND.

The output transistor $Tr_{18}$ has an emitter connected to the voltage supply Vcc and a collector connected to the output terminal To.

In the comparator 40, when the input voltage Vin is lower than the reference voltage $V_R$, the collector current of the transistor $Tr_{16}$ is kept constant. At this time, the same base current as supplied to the transistor $Tr_{16}$ is supplied to the transistor $Tr_{17}$, turning on the transistor $Tr_{17}$. As the transistor $Tr_{17}$ is enabled, the transistor $Tr_{18}$ is turned on. At this time, an output signal (Vout) is generated on the collector of the transistor $Tr_{18}$ and an H-level output signal (Vout) is output from the output terminal To.

When the input voltage Vin is higher than the reference voltage $V_R$, the collector current of the transistor $Tr_{14}$ increases, causing the collector current of the transistor $Tr_{12}$ to decrease. At this time, the supply of the base current to the transistor $Tr_{17}$ is cut off, thereby turning off the transistor $Tr_{17}$. As the transistor $Tr_{17}$ is disabled, the transistor $Tr_{18}$ is turned off.

When the H-level output signal (Vout) is output from the output terminal To, the transistor $Tr_{16}$ is turned on, allowing the collector current to flow to absorb a part of the bias current $I_B$. The transistors $Tr_{12}$ and $Tr_{16}$ form a negative feedback loop so that the collector current of the transistor $Tr_{16}$ converges to a predetermined value equal to or smaller than the bias current $I_B$.

If the transistors $Tr_{16}$ and $Tr_{17}$ are of the same size, the collector current of the transistor $Tr_{17}$ becomes equal to the collector current of the transistor $Tr_{16}$.

In the comparator 40, therefore, the base current of the output transistor $Tr_{18}$ is set by the collector current of the transistor $Tr_{16}$, thus making it possible to prevent the current consumption from being increased by a needless increase in the base current of the output transistor $Tr_{18}$.

It should be apparent to those skilled in the art that the present invention may be embodied in many other specific forms without departing from the spirit or scope of the invention. Particularly, it should be understood that the invention may be embodied in the following forms.

In the second embodiment, the transistor $Tr_{10}$ may be replaced with a Darlington-connected transistor. In this case, it is possible to further reduce the flow-in current $I_{BI}$ to the hold capacitor 2.

In the second and third embodiments, the PNP transistors may be replaced with NPN transistors and the NPN transistors may be replaced with PNP transistors in which case the directions of the supply voltage and the currents should be reversed. In this case, the peak hold circuit holds the maximum input voltage.

In the fourth embodiment, the transistor $Tr_{18}$ may be omitted so that the output signal (Vout) is generated on the collector of the transistor $Tr_{17}$.

Therefore, the present examples and embodiments are to be considered as illustrative and not restrictive and the invention is not to be limited to the details given herein, but may be modified within the scope and equivalence of the appended claims.

What is claimed is:

1. A differential circuit for receiving first and second input voltages, the differential circuit comprising:

a first input transistor for receiving the first input voltage;

a second input transistor, connected to the first input transistor, for receiving the second input voltage;

a current source, connected to the first and second input transistors, for supplying bias current to the first and second input transistors; and a bypass circuit, connected to the first and second input transistors and the current source, for bypassing the bias current to suppress an increase in collector current of the first input transistor or the second input transistor based on the first and second input voltages.

2. A differential circuit for receiving first and second input voltages, the differential circuit comprising:

a first input transistor for receiving the first input voltage;

a second input transistor, connected to the first input transistor, for receiving the second input voltage;

a current mirror circuit, connected to the first and second input transistors, for supplying identical collector current to the first and second input transistors; and a negative feedback circuit, connected to the first and second input transistors, for suppressing an increase in base current of the second input transistor based on the first and second input voltages.

3. The differential circuit according to claim 2, further comprising a current source, connected to the first and second input transistors and the negative feedback circuit, for supplying bias current to the first and second input transistors.

4. A peak hold circuit for receiving an input voltage and making a hold voltage, the peak hold circuit comprising:
   a first input transistor having a base for receiving an input voltage;
   a second input transistor connected to the first input transistor and having a base for receiving the hold voltage;
   a current mirror circuit, connected to the first and second input transistors, for supplying identical collector current to the first and second input transistors;
   a hold capacitor, connected to the second input transistor, for supplying the hold voltage to the second input transistor;
   a reset switch, connected to the hold capacitor, for resetting the hold voltage;
   a hold-voltage setting transistor, connected to the hold capacitor and the first and second input transistors, for receiving base current from the collector of the first input transistor and making the hold voltage coincide with the input voltage in accordance with the base current; and
   a bypass circuit, connected to the second input transistor, for bypassing bias current to be supplied to the second input transistor when the hold-voltage setting transistor is turned off.

5. The peak hold circuit according to claim 4, further comprising a current source, connected to the first and second input transistors and the bypass circuit, which supplies the bias current to the first and second input transistors.

6. A peak hold circuit for receiving an input voltage and making a hold voltage, the peak hold circuit comprising:
   a first differential circuit including a first input transistor having a base for receiving the input voltage and a collector, a second input transistor connected to the first input transistor and having a base for receiving the hold voltage, and a first current mirror circuit, connected to the first and second input transistors, for supplying a same collector current to the first and second input transistors;
   a hold capacitor, connected to the second input transistor, for supplying the hold voltage to the second input transistor;
   a reset switch, connected to the hold capacitor, for resetting the hold voltage;
   a hold-voltage setting transistor, connected to the hold capacitor and the first and second input transistors, for receiving base current from the collector of the first input transistor and making the hold voltage coincide with the input voltage in accordance with the base current;
   a second differential circuit connected in parallel to the first differential circuit and including a third input transistor having a base for receiving the input voltage, a fourth input transistor connected to the hold capacitor and having a base for receiving the hold voltage, and a second current mirror circuit, connected to the third and fourth input transistors, for supplying identical collector current to the third and fourth input transistors; and
   a negative feedback circuit, connected to the second input transistor, for reducing a bias current to the second input transistor in accordance with the hold voltage when the hold-voltage setting transistor is turned off due to voltage difference between the input voltage and the hold voltage.

7. The peak hold circuit according to claim 6, further comprising a current source, connected to the first to fourth input transistors and the negative feedback circuit, for supplying the bias current to the first to fourth input transistors.

8. The peak hold circuit according to claim 6, wherein the first to fourth input transistors are PNP transistors and the fourth input transistor includes a collector,
   the negative feedback circuit includes an NPN transistor for absorbing the bias current to the second input transistor in accordance with base current supplied from the collector of the fourth input transistor, and
   the hold capacitor is connected between the bases of the second and fourth input transistors and the low-potential power supply, and holds the minimum value of the input voltage.

9. The peak hold circuit according to claim 8, wherein the negative feedback circuit includes:
   a first NPN transistor connected to the fourth input transistor and having a collector for receiving collector current from the collector of the fourth input transistor, and a base; and
   a second NPN transistor connected to the first NPN transistor which performs a current mirror operation together with the first NPN transistor.

10. A method of holding a voltage in a peak hold circuit that includes a current source, a bypass circuit connected to the current source, a first input transistor, a second input transistor, a hold capacitor connected to the second input transistor for holding the voltage, and a hold-voltage setting transistor connected to the hold capacitor for charging and discharging the hold capacitor, the method comprising the steps of:
   supplying bias current from the current source to the first input transistor and the second input transistor;
   supplying an input voltage to the first input transistor and supplying a hold voltage from the hold capacitor to the second input transistor;
   allowing the first input transistor to enable the hold-voltage setting transistor to discharge the hold capacitor when the input voltage is lower than the hold voltage; and
   disabling the hold-voltage setting transistor and allowing the bypass circuit to bypass bias current to be supplied to the second input transistor, when the hold voltage decreases to the input voltage.

11. A comparator for receiving first and second input voltages, the comparator comprising:
   a first input transistor for receiving the first input voltage;
   a second input transistor, connected to the first input transistor, for receiving the second input voltage;
   a current mirror circuit, connected to the first and second input transistors, for supplying identical collector current to the first and second input transistors;
   a negative feedback circuit, connected to the first and second input transistors, for suppressing an increase in collector current of the first input transistor or the second input transistor based on the first and second input voltages; and an output transistor connected to the current mirror circuit and the negative feedback circuit and driven by the current mirror circuit and the negative feedback circuit.

12. The comparator according to claim 11, further comprising a current source, connected to the first and second input transistors and the negative feedback circuit, for supplying bias current to the first and second input transistors, and wherein the negative feedback circuit reduces base current of the output transistor by reducing bias current received from the current source in accordance with the first and second input voltages.

13. The comparator according to claim 12, wherein it is for use with a low-potential voltage supply, and the negative feedback circuit includes a feedback transistor having a collector connected to the current source, a base connected to a collector of the first input transistor and an emitter connected to the low-potential voltage supply, the comparator further comprising a drive transistor having a collector connected to a base of the output transistor, a base connected to the base of the feedback transistor and an emitter connected to the low-potential voltage supply, and size of the feedback transistor is substantially the same as size of the drive transistor.

14. A comparator for receiving first and second input voltages, the comparator comprising:

a first input transistor having a base for receiving the first input voltage and a collector;

a second input transistor having an emitter connected to an emitter of the first input transistor and a base for receiving the second input voltage;

high-potential and low-potential voltage supplies;

a current source connected between the emitter of the first input transistor, the emitter of the second input transistor and the high-potential voltage supply;

a first NPN transistor having a collector connected to the collector of the first input transistor, an emitter connected to a low-potential voltage supply, and a base;

a second NPN transistor having a base connected to the base and the collector of the first NPN transistor and an emitter connected to the low-potential voltage supply;

a feedback transistor having a collector connected to the current source, the emitter of the first input transistor and the emitter of the second input transistor, a base connected to the collector of the first input transistor and an emitter connected to the low-potential voltage supply;

a drive transistor having a base connected to the base of the feedback transistor and an emitter connected to the low-potential voltage supply;

an output transistor having a base connected to a collector of the drive transistor, an emitter connected to the high-potential voltage supply and a collector; and an output terminal connected to the collector of the output transistor.

\* \* \* \* \*